(12) United States Patent
La Rosa

(10) Patent No.: US 11,056,180 B2
(45) Date of Patent: Jul. 6, 2021

(54) NON-VOLATILE MEMORY DATA BUS

(71) Applicant: STMicroelectronics (Rousset) SAS, Rousset (FR)

(72) Inventor: Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/853,036

(22) Filed: Apr. 20, 2020

(65) Prior Publication Data
US 2020/0342930 A1    Oct. 29, 2020

(30) Foreign Application Priority Data

Apr. 26, 2019 (FR) .................... 1904443

(51) Int. Cl.
| | |
|---|---|
| G11C 11/4094 | (2006.01) |
| G11C 11/408 | (2006.01) |
| G11C 11/4091 | (2006.01) |
| G11C 11/4099 | (2006.01) |
| G11C 5/02 | (2006.01) |

(52) U.S. Cl.
CPC .......... *G11C 11/4094* (2013.01); *G11C 5/025* (2013.01); *G11C 11/4087* (2013.01); *G11C 11/4091* (2013.01); *G11C 11/4099* (2013.01)

(58) Field of Classification Search
CPC . G11C 11/4094; G11C 5/025; G11C 11/4087; G11C 11/4091; G11C 11/4099; G11C 29/80; G11C 29/81; G11C 2207/005; G11C 7/18; G11C 16/26; G11C 16/02; G11C 7/1006
See application file for complete search history.

(56) References Cited

U.S. PATENT DOCUMENTS

| | | | |
|---|---|---|---|
| 8,023,319 B2 * | 9/2011 | Cho ............... | G11C 29/808 365/163 |
| 9,037,948 B2 * | 5/2015 | Cordero ........... | G06F 11/073 714/764 |
| 2006/0034141 A1 | 2/2006 | Iioka et al. | |
| 2008/0043544 A1 * | 2/2008 | Liaw .............. | G11C 7/1096 365/191 |
| 2011/0205824 A1 * | 8/2011 | Kajigaya .......... | G11C 7/1006 365/219 |
| 2014/0269087 A1 | 9/2014 | Rhie | |
| 2018/0025757 A1 * | 1/2018 | Chan .............. | G11C 7/1045 365/189.02 |
| 2019/0139594 A1 * | 5/2019 | Ryu ............... | G11C 7/1042 |
| 2019/0164621 A1 * | 5/2019 | Kim ............... | G11C 29/806 |
| 2020/0201649 A1 * | 6/2020 | Hush .............. | G11C 7/1006 |

FOREIGN PATENT DOCUMENTS

WO        2008031074 A1    3/2008

OTHER PUBLICATIONS

INPI Search Report and Written Opinion for FR 1904443 dated Jan. 30, 2020 (13 pages).

* cited by examiner

*Primary Examiner* — Tri M Hoang
(74) *Attorney, Agent, or Firm* — Crowe & Dunlevy

(57) ABSTRACT

A non-volatile memory integrated circuit has a memory plane organized into rows and into columns containing bit lines. The read amplifiers for each bit line are configured to generate an output signal on a read data channel. The read data channels respectively run through the memory plane along each bit line. Each read data channel is connected to all of the read amplifiers of the respective bit line.

21 Claims, 4 Drawing Sheets

NON-VOLATILE MEMORY DATA BUS

PRIORITY CLAIM

This application claims the priority benefit of French Application for Patent No. 1904443, filed on Apr. 26, 2019, the content of which is hereby incorporated by reference in its entirety to the maximum extent allowable by law.

TECHNICAL FIELD

Embodiments relate to non-volatile memory integrated circuits, in particular data buses in non-volatile memories.

BACKGROUND

Non-volatile memories conventionally comprise a memory plane equipped with memory cells, each memory cell being capable of saving a bit. The memory plane is typically organized into rows and into columns containing bit lines.

The bit lines make it possible, in particular, to access a memory cell in order to read the saved item of data therefrom, and for this purpose contain a dedicated read amplifier. The bit lines conventionally run through the memory plane over the entire length thereof (in the direction of the columns). The term "bit line" is understood to mean a conceptual element of the organization of the memory plane, and not just the physical metal line for routing signals.

At the periphery of the memory plane, in particular, row and column decoders are provided in order to access the memory cells in matrix form.

Architectures for segmenting the memory plane have been proposed to form smaller memory plane segments in order to reduce stray effects in the metal lines forming the bit lines. The memory plane segments may share read amplifiers.

Each read amplifier is conventionally configured to generate an output signal on a read data channel. The read data channels of a memory plane segment are grouped together on a respective read data bus, for example 138 channels per bus. The channels of the read data buses of each memory plane segment are multiplexed to an output bus of the memory.

Thus, there is firstly, at the periphery of the memory plane, one multiplexer circuit per memory plane segment and an output bus of the memory, and increasing the number of memory plane segments increases the complexity of the multiplexing of the data on the output bus.

Secondly, at least one additional bit line, called a redundant bit line, is conventionally provided in order to be able to replace a possibly deficient memory cell in each row of the memory plane segment. The deficiency of a memory cell may occur statistically in production and the memory cells to be replaced by a memory cell of the redundant bit line are identified in the factory in a test phase.

The addressing of the memory plane in order to implement the replacement via redundancy is coded in the factory by way in particular of an additional multiplexing circuit, typically itself also situated at the periphery of the memory plane.

There are thus at least two multiplexing levels for reaching the output bus with at least N+1 multiplexer blocks, N being the number of memory plane segments. The multiplexer blocks are situated at the periphery of the memory plane, as are the data channel buses that they control.

A large number of metal lines, for the data channels of the buses, thus run through the periphery of the memory plane. This firstly creates a congestion that is both complex and widespread. Secondly, the space taken up by the metal lines leaving the read amplifier banks limit the possibility of reducing the size of the read amplifiers. Furthermore, the read data channels are formed by thin metal lines that have a significant inherent propagation delay. Thicker metal lines are not currently used for read data channels on the periphery, firstly due to their significant thickness multiplied by the high number of channels, and secondly because thicker metal lines at the periphery are generally intended to provide a solid power supply to the circuits at the periphery.

SUMMARY

According to some embodiments, it is proposed to route the read data channels above the memory plane, so as to unburden the periphery, freeing up space in particular with regard to the read amplifier banks, while at the same time using thicker metal lines that introduce less propagation delay.

According to one aspect, what is proposed in this respect is a non-volatile memory integrated circuit, having a memory plane organized into rows and into columns containing bit lines, each bit line containing read amplifiers each configured to generate an output signal on a read data channel, wherein the read data channels respectively run through the memory plane along (i.e., parallel to) each bit line, and each read data channel is connected to all of the read amplifiers of the respective bit line.

Thus, all of the abovementioned problems linked to the read data channel buses situated at the periphery of the memory plane are avoided.

According to one embodiment, each bit line further contains a multiplexing element configured to provide a data signal on an output bus of the non-volatile memory, based on the output signals delivered by the read amplifiers of the bit line.

The periphery of the memory plane is thus decongested since it does not contain either the read data channel buses or the multiplexing elements of the memory plane segments.

According to one embodiment, the multiplexing elements may be located in a region extending in the direction of the rows and situated in the middle of the columns of the memory plane.

This is advantageous in terms of architecture, in particular a symmetrical and compact structure.

According to one embodiment, the multiplexing elements are configured to further receive at least one decoding parameter signal transmitted respectively via at least one decoding parameter channel common to the multiplexing elements.

According to one embodiment, the integrated circuit comprises at least one redundant bit line, wherein the multiplexing element of the redundant bit line is configured to provide a redundancy data signal on a redundancy data channel, based on the output signals delivered by the read amplifiers of the redundant bit line, the redundancy data channel being connected to redundancy data inputs of the multiplexing elements of the other bit lines.

The redundant bit line has substantially the same structure as the other bit lines, that is to say that the memory cells, the read amplifiers and the associated read data channels are the same, only the multiplexing element of the redundant bit line being configured differently, for example in response to the decoding parameters.

According to one embodiment, said multiplexing elements of the other bit lines (that is to say the bit lines that are not the redundant bit line) are configured to receive a redundancy data selection command on a redundancy data selection bus and, on the basis of the selection command, to provide said data signal based on the output signals delivered by the corresponding read amplifiers, or based on a redundancy data signal delivered on the redundancy data inputs.

For example, the redundancy data channel comprises two differential lines, the multiplexing element of the redundant bit line being configured to provide a redundancy data signal comprising two inverse digital signals.

According to one embodiment, the read data channels each comprise two differential lines, each read amplifier being configured to provide an output signal comprising two inverse digital signals.

These uses of inverse digital signals on two differential lines is advantageous in terms of data transmission, since they may contain both the information about the value of the item of data and the information about the availability (about a ready state) of the item of data in read mode.

According to one embodiment, the integrated circuit has an interconnect portion comprising a stack of metal levels, wherein the read data channels belong to a metal level comprising metal tracks having a minimum width greater than 0.5 µm.

This is made possible by virtue of providing read data channels in accordance with this aspect, and makes it possible to reduce the propagation time of the read data.

According to one embodiment, the read data channels comprise at least one electromagnetic shielding channel and one direct-access programming bus channel between them.

The direct-access programming channel may act as shielding channel when an item of data is read by the read amplifiers. This simple and advantageous embodiment is made possible by virtue of distributing the read data channels above the memory plane, these therefore not being congested with regard to the read amplifiers.

According to one embodiment, the memory plane is segmented into memory plane segments, each bit line of each memory plane segment containing a read amplifier.

Specifically, the abovementioned congestion at the periphery of the memory plane is particularly problematic in a segmented architecture of the memory plane, and the integrated circuit as defined above is thus particularly advantageous in this type of architecture.

BRIEF DESCRIPTION OF THE DRAWINGS

Other advantages and features of the invention will become apparent upon examining the detailed description of completely non-limiting embodiments and the appended drawings, in which.

DETAILED DESCRIPTION

Figure 1:
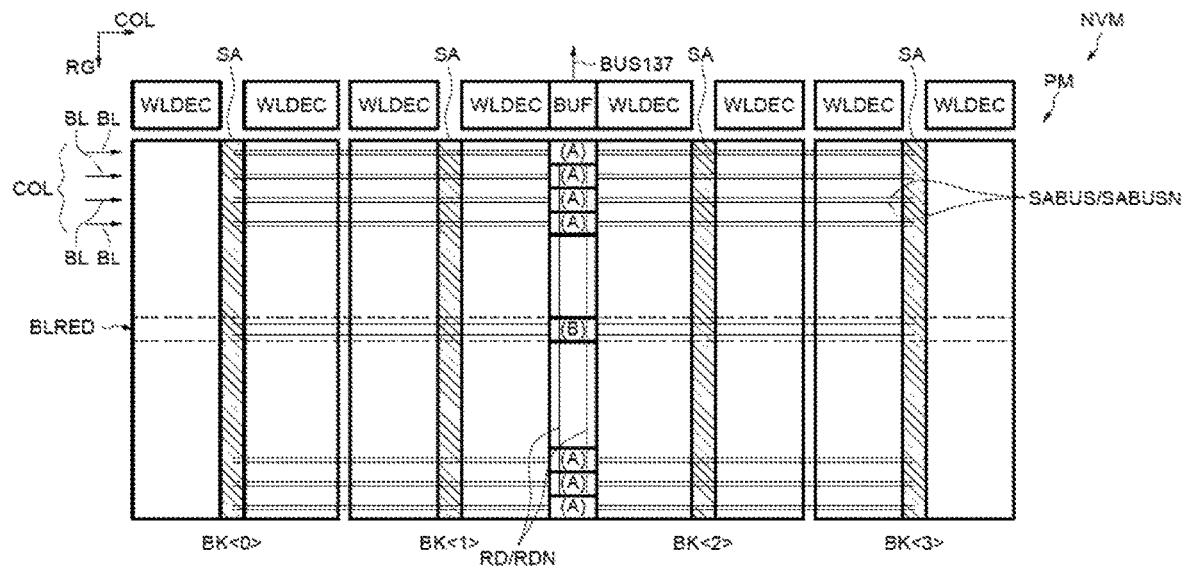
FIG. 1 illustrates a non-volatile memory integrated circuit having a memory plane.

FIG. 1 shows a non-volatile memory NVM integrated circuit having a memory plane PM.

The memory plane PM is organized into rows RG and into columns COL, each column COL containing a plurality of bit lines BL.

In this organization, the intersection between a column and a row comprises a memory word, for example of 128 bits, that is to say 128 memory cells. 8 additional bits for an error correction code (ECC) mechanism, 1 parity bit and 1 redundancy bit may optionally be provided, forming a total of 138 memory cells per memory word.

In this example, the memory plane PM is segmented into memory plane segments BK<i>, i=0 to 3, and each bit line BL of each memory plane segment BK<i> contains a read (sense) amplifier SA. The read amplifiers SA are located in the middle of the rows of segments BK<i>.

Each bit line BL contains read amplifiers SA each configured to generate an output signal (SAOUT/SAOUTN—FIG. 3) on a read data channel SABUS/SABUSN.

Of course, the term "bit line" is considered to mean a conceptual element of the organization of the memory plane, and not just the physical metal line for routing signals.

The read data channels SABUS/SABUSN respectively run through the memory plane PM along each bit line BL. Each read data channel SABUS/SABUSN is connected to all of the read amplifiers SA of the respective bit line BL.

In each bit line BL, the output signals from the read amplifiers SA are thus routed, via the read data channels SABUS/SABUSN, to a respective multiplexing element A, advantageously located in a region situated in the middle of the columns COL of the memory plane PM and extending in the direction of the rows RG.

Each multiplexing element A is configured to provide a data signal OUT<n> on an output bus BUS137 of the non-volatile memory NVM, based on the output signals SAOUT/SAOUTN delivered by the read amplifiers of the bit line BL.

The output bus BUS137 of the non-volatile memory NVM is situated at an end of the region situated in the middle of the columns COL, and may be connected directly to its destination without an intermediate element (in particular without an additional multiplexer at the periphery of the memory plane PM).

This is also compatible with a design that provides at least one redundant bit line BLRED.

Figure 2:
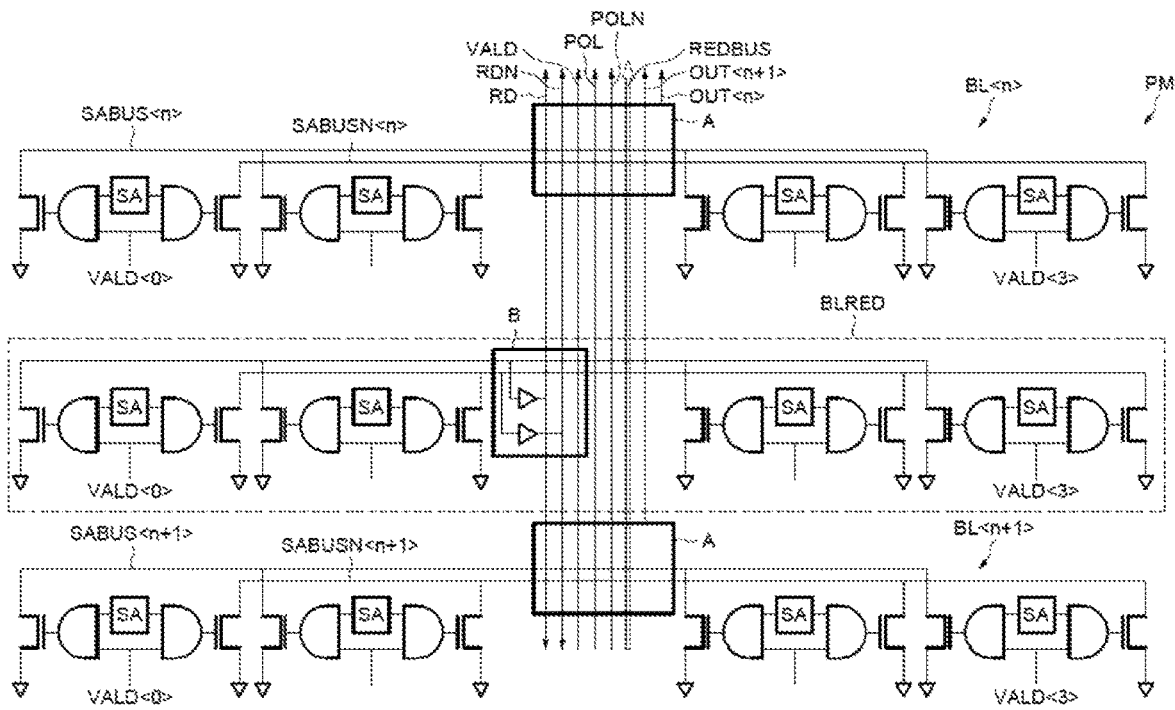
FIG. 2 illustrates various channels in relation to read amplifiers and multiplexing elements.

Reference is now made to FIG. 2, showing in particular the various channels in relation to the read amplifiers SA and the multiplexing elements A, B.

The memory plane PM comprises a redundant bit line BLRED having a specific multiplexing element B.

Specifically, the multiplexing element B of the redundant bit line BLRED is configured in this example to provide a redundancy data signal RD/RDN on a redundancy data channel RD, RDN, based on the output signals (SAOUT_RED/SAOUTN_RED—FIG. 3) delivered by the read amplifiers SA of the redundant bit line BLRED.

Of course, the output signals from the read amplifiers SA of the redundant bit line BLRED are also transmitted via read data channels SABUS/SABUSN that run through the memory plane PM along the redundant bit line BLRED and that are connected to all of the read amplifiers SA of the redundant bit line BLRED.

The redundancy data channel RD/RDN is connected to redundancy data inputs of the multiplexing elements A of the other bit lines BL, called regular bit lines.

Furthermore, the multiplexing elements A of the regular bit lines BL may in this case be configured to receive a redundancy data selection command on a redundancy data selection bus REDBUS.

And, on the basis of the selection command, the multiplexing elements A provide the data signal OUT<n> either based on the output signals (SAOUT/SAOUTN) delivered by the corresponding read amplifiers SA or based on the redundancy data signal delivered on the redundancy data inputs RD, RDN by the multiplexing element B specific to the redundant bit line BLRED.

The multiplexing elements A, B may also be configured to further receive at least one decoding parameter signal transmitted respectively via at least one decoding parameter channel VALD, POL/POLN common to the multiplexing elements A, B.

Specifically, the decoding parameter signals may, for example, comprise a validity signal VALD indicating that the read amplifiers have finished a data reading process, or else a polarity signal POL/POLN, in the context of communication on differential lines.

Specifically, the redundancy data channel RD/RDN and/or the read data channels SABUS/SABUSN may comprise two differential lines, each transmitting a digital signal that is the inverse of the other.

This makes it possible to avoid communication errors caused by stray transitions that may occur on one of the two channels, before the read amplifier has effectively delivered its output. Specifically, the differential lines may transmit information about the validity value of an item of data at the same time.

Furthermore, the read amplifiers SA, each being shared between two halves of the memory plane segments BK<i> (see FIG. 1), are advantageously configured to perform a differential measurement between the cells of each of the two halves, on the respective bit line BL. Thus, depending on whether the measurement should be performed on one or the other of the two halves, the polarity of the measured differential signal is or is not inverted, and this is controlled by the polarity signal POL/POLN.

In other words, the polarity signal makes it possible to define a convention of reading a 0 or a 1 on the differential signal from such a differential read amplifier SA.

In summary, in the example of FIG. 2, the read data channels SABUS/SABUSN make it possible to route the output signals from the read amplifiers SA to the respective multiplexing element A.

The polarity signal transmitted on a channel POL/POLN makes it possible to define a differential reading convention.

The validity signal transmitted on a respective channel VALD makes it possible to provide end-of-read information in order to recover the data. The end-of-read information is obtained when a read amplifier SA of one of the banks BK<i> transmits a respective validity signal VALD<i> (0<i<3).

A redundancy data selection signal is transmitted on a redundancy data selection bus REDBUS to identify a read operation requiring the recovery of a redundancy bit from the redundant bit line BLRED. The redundancy data selection signal may for example comprise a code on a plurality of bits in order to identify the bit line BL to be transferred to the redundant bit line BLRED for the read operation.

The data read, where applicable, from the redundant bit line BLRED are transmitted to the identified multiplexing element A via the redundancy data channels RD/RDN, from the multiplexing element B of the redundant bit line BLRED.

The final read data OUT<n>, OUT<n+1> are transmitted by the multiplexing elements A, depending on the output signals (SAOUT/SAOUTN) from the read amplifiers SA with the polarity convention defined by the polarity signal POL/POLN (or else depending on the signals from the redundancy data channel RD/RDN if there is identification by the redundancy data selection signal), accompanied by the validity signal VALD authorizing the recovery of the data.

These numerous functions of the multiplexing elements A may be implemented by the exemplary embodiment described with reference to FIGS. 3 and 4.

Figure 3:
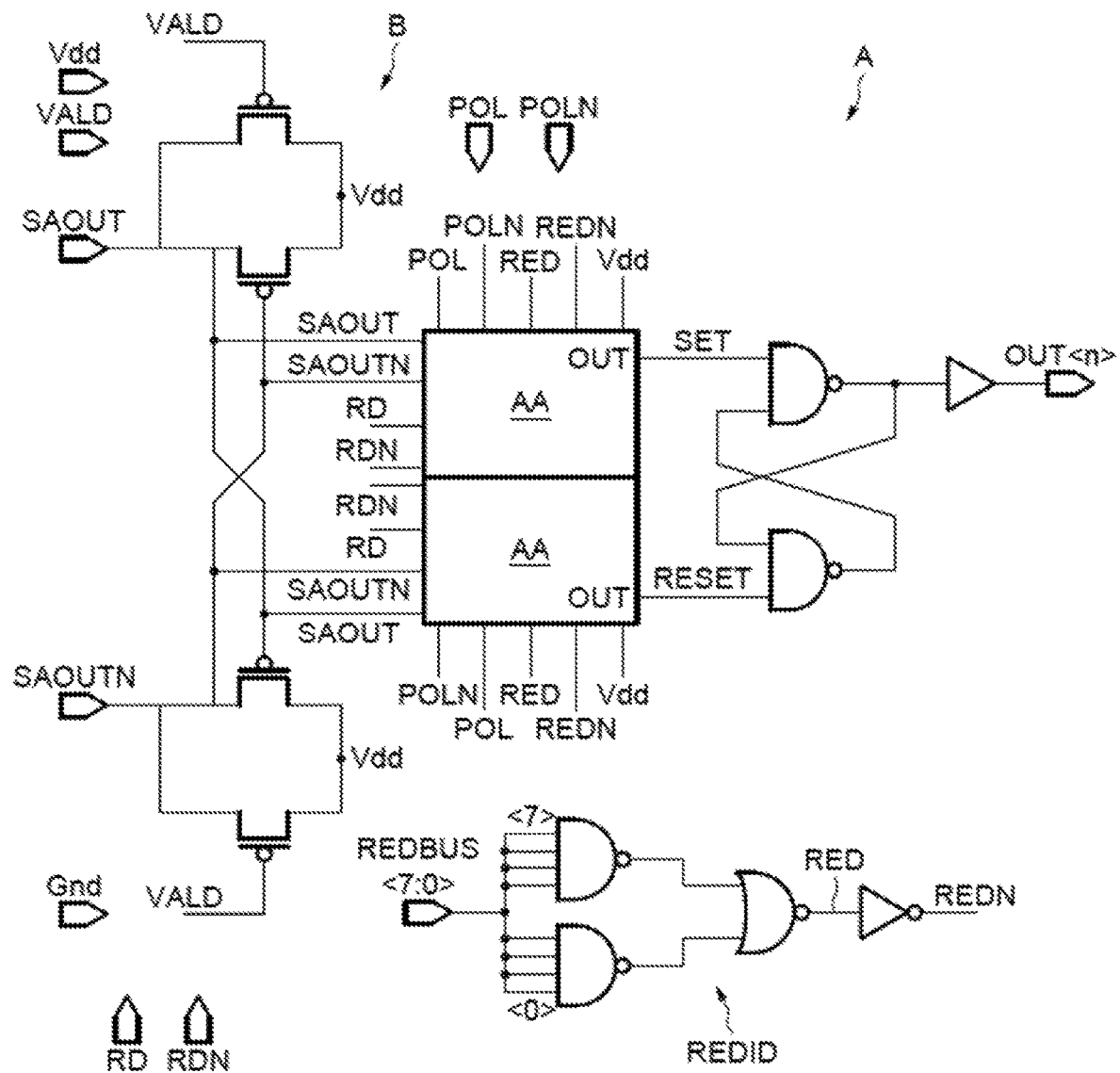
FIG. 3 illustrates an embodiment of a multiplexing element.

Reference is made in this respect to FIG. 3.

FIG. 3 shows one exemplary embodiment of an advantageous multiplexing element A.

According to the example of FIG. 2, the multiplexing element A has inputs for receiving the signals that control it, such as decoding parameters, and data signals.

The multiplexing element A thus comprises read data inputs SAOUT and SAOUTN, redundancy data inputs RD and RDN, a validity signal input VALD, polarity inputs POL and POLN, a redundancy data selection bus input on 8 bits REDBUS<7:0>, and power supply inputs Vdd and Gnd and a data output OUT<n>.

An identification logic assembly REDID makes it possible to perform a logic test specific to each multiplexing element A, on the 8 bits of the redundancy data selection signal REDBUS<7:0>. The identification logic assembly REDID delivers an identification signal RED/REDN representative of a selected or unselected state of the multiplexing element A in order to recover the redundancy data.

The multiplexing element A has two complex logic gates AA each making it possible to verify all of the conditions described above with reference to FIG. 2, except for the conditions of the validity signal VALD, in order to deliver the corresponding item of data on an output OUT.

The output OUT of the first complex logic gate AA is connected to a set input SET of an RS latch, whereas the output OUT of the second complex logic gate AA is connected to a reset input RESET of the RS latch.

The second complex logic gate receives the inverse polarity POLN/POL with respect to the first complex logic gate POL/POLN.

The read data SAOUT/SAOUTN are transmitted to the complex logic gates AA by way of a preload device B, configured to transmit the data signals SAOUT/SAOUTN if the validity condition is met by the validity signal VALD=1.

The multiplexing element B specific to the abovementioned redundant bit line BLRED may, for example, simply comprise such a preload device connected to the redundancy data channel RD/RDN. Thus, said specific multiplexing element B still transfers the data from the read amplifiers of the redundant bit line BLRED to all of the multiplexing elements A of the regular bit lines, the latter being responsible for selecting them or not selecting them depending on the redundancy data selection code transmitted on the bus REDBUS.

The RS latch thus delivers the real item of data OUT<n>, with all of the conditions met.

Figure 4:
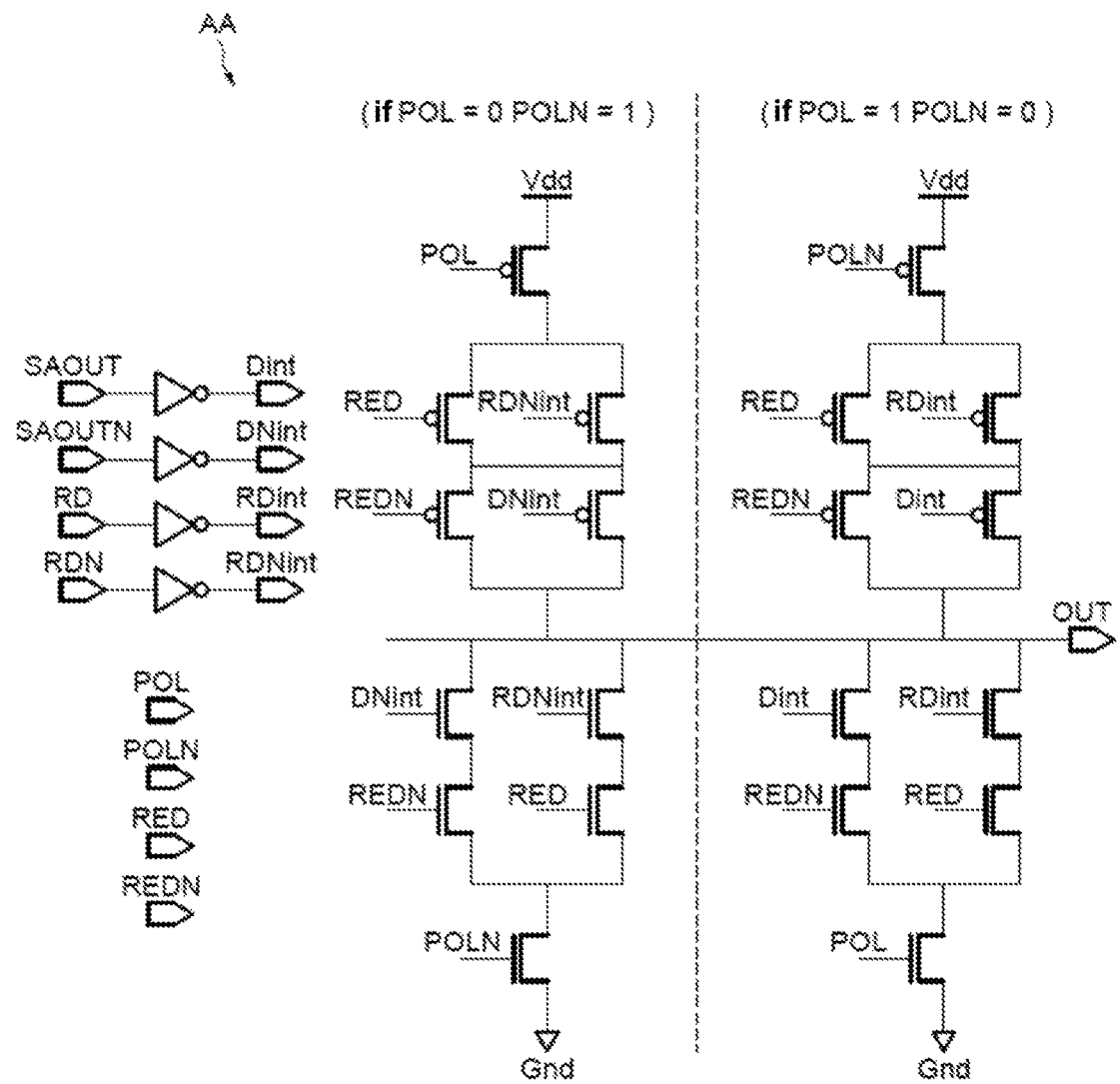
FIG. 4 illustrates an exemplary embodiment of a complex logic gate.

Reference is now made to FIG. 4, which shows one exemplary embodiment of such a complex logic gate AA.

The complex logic gate AA receives the data signals SAOUT, SAOUTN from the preload device B, and inverts them in order to form internal data signals, respectively Dint, DNint.

The redundancy data signals RD, RDN are also received and inverted in order to form internal redundancy data signals, respectively RDint, RDNint.

The identification signals RED, REDN coming from the identification logic assembly and the polarity signals POL, POLN are also received.

In FIG. 4, the complex logic gate AA is separated into two parts by a broken line, one corresponding to a first polarity such that POL=1 and POLN=0, the other to the inverse polarity, that is to say POL=0 and POLN=1.

In the case of the first polarity POL=1 and POLN=0, an N-type transistor is put into the on state by the signal POL and connects the ground Gnd (Gnd=logic 0) to two parallel branches each having a pair of N-type transistors in series. Said branches are also connected to the output OUT of the complex logic gate AA.

The first branch transmits Gnd to the output OUT if the signal RED=1 and if RDint=1 (that is to say RD=0). In other words, if the redundancy identification is validated (RED=1, REDN=0) and if the received redundancy item of data is 0 (RD=0), the output OUT is set to 0.

The second branch transmits Gnd to the output OUT if the signal REDN=1 and if Dint=1 (that is to say SAOUT=0). In other words, if the redundancy identification is not validated (RED=0, REDN=1) and if the received read item of data is 0 (SAOUT=0), the output OUT is set to 0.

Furthermore, still in the case of the first polarity POL=1 and POLN=0, a P-type transistor is put into the on state by the signal POLN and connects two cross-coupled branches each having a pair of P-type transistors in series to the power supply Vdd (Vdd=logic 1). Said branches are also connected to the output OUT of the complex logic gate AA.

The first branch transmits Vdd to the output OUT if the signal RED=0 and if Dint=0 (that is to say SAOUT=1). In other words, if the redundancy identification is not validated (RED=0, REDN=1) and if the received read item of data (SAOUT=1) is 1, the output OUT is set to 1.

The second branch transmits Vdd to the output OUT if the signal REDN=0 and if RDint=0 (that is to say RD=1). In other words, if the redundancy identification is validated (RED=1, REDN=0) and if the received redundancy item of data (RD=1) is 1, the output OUT is set to 1.

In the portion corresponding to the inverse polarity POL=0 and POLN=1, the circuit is the same but the transistors that are commanded by the data signals (Dint, RDint) are commanded by the inverse data signals DNint, RDNint, to confer the inverse bias on the output OUT in each of the cases described above.

Figure 5:
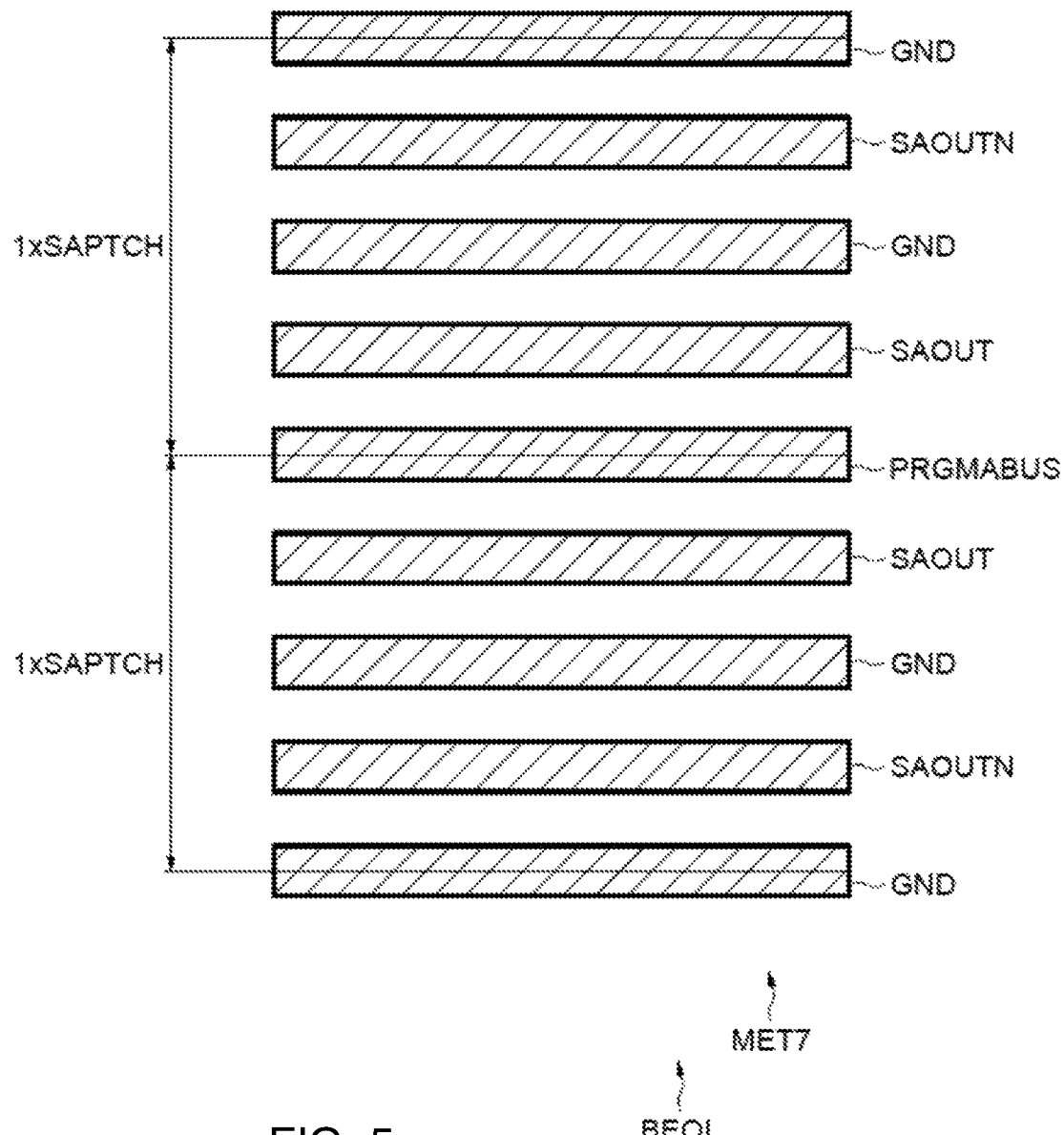
FIG. 5 illustrates a plan view of a metal level of an interconnect portion of the non-volatile memory integrated circuit.

FIG. 5 shows a plan view of a metal level MET7 of an interconnect portion BEOL of the non-volatile memory (NVM) integrated circuit.

The interconnect portion BEOL comprises a stack of metal levels, in one of which the read data channels SAOUT/SAOUTN are formed.

The read data channels SAOUT/SAOUTN may comprise at least one electromagnetic shielding channel GND and one direct-access programming bus channel PRGDAMBUS between them.

The direct-access programming bus channel PRGDAMBUS is biased to ground GND during the read operation, and thus acts as electromagnetic shield.

In particular, the integrated circuit described above with reference to FIGS. 1 and 2 makes it possible to form the read data channels SAOUT/SAOUTN in a metal level comprising metal tracks having a minimum thickness greater than 0.5 µm, for example the seventh metal level MET7.

Specifically, the reference 1×SAPTCH denotes the width dedicated to a read amplifier in a bit line BL. Thus, given that only four channels per width 1×SAPTCH are necessary here (since they optionally in this example comprise shielding channels, and further have a differential configuration with two channels per signal), metal levels having thick tracks are able to be used.

This gives a major advantage in terms of propagation time of the signals, in particular in the read data channels.

Some particular embodiments have been described, but that being said, the invention is not limited to these embodiments, but incorporates all variants thereof, for example the circuits of multiplexing elements described with reference to FIGS. 3 and 4 are simple design examples, and any other architecture having an analogous function may of course be contemplated in the context of the invention.

The invention claimed is:

1. A non-volatile memory integrated circuit, comprising:
a memory plane organized into rows and into columns containing bit lines;
read amplifiers for each bit line that are configured to generate an output signal on a read data channel;
a multiplexing element for each bit line that is configured to provide a data signal on an output bus of the non-volatile memory integrated circuit based on the output signals delivered by the read amplifiers of the bit line;
wherein the read data channels respectively run through the memory plane along each bit line; and
wherein each read data channel is connected to all of the read amplifiers of the respective bit line.

2. The integrated circuit according to claim 1, wherein the multiplexing elements are located in a region extending in the direction of the rows and situated in the middle of the columns of the memory plane.

3. The integrated circuit according to claim 1, wherein the multiplexing elements are further configured to receive at least one decoding parameter signal transmitted respectively via at least one decoding parameter channel common to the multiplexing elements.

4. The integrated circuit according to claim 1, further comprising at least one redundant bit line, wherein the multiplexing element of the redundant bit line is configured to provide a redundancy data signal on a redundancy data channel, based on the output signals delivered by the read amplifiers of the redundant bit line, the redundancy data channel being connected to redundancy data inputs of the multiplexing elements of the other bit lines.

5. The integrated circuit according to claim 4, wherein said multiplexing elements of the other bit lines are configured to receive a redundancy data selection command on a redundancy data selection bus and, on the basis of the redundancy data selection command, provide said data signal based on the output signals delivered by the corresponding read amplifiers, or based on the redundancy data signal delivered on the redundancy data inputs.

6. The integrated circuit according to claim 4, wherein the redundancy data channel comprises two differential lines, the multiplexing element of the redundant bit line being configured to provide the redundancy data signal comprising two inverse digital signals.

7. The integrated circuit according to claim 1, wherein the read data channels each comprise two differential lines, each read amplifier being configured to provide the output signal comprising two inverse digital signals.

8. The integrated circuit according to claim 1, further comprising an interconnect portion comprising a stack of metal levels, wherein the read data channels are provided in a metal level of said stack which comprises metal tracks having a minimum width greater than 0.5 µm.

9. The integrated circuit according to claim 8, wherein the read data channels comprise at least one electromagnetic shielding channel and one direct-access programming bus channel.

10. The integrated circuit according to claim 1, wherein the memory plane is segmented into memory plane segments, each bit line of each memory plane segment containing the read amplifier.

11. A non-volatile memory integrated circuit, comprising:
a memory plane organized into rows and into columns containing bit lines;
a read amplifier coupled to each bit line and configured to generate an output signal on a read data channel;
an interconnect portion extending above the memory plane and comprising a stack of metal levels, wherein at least one metal level includes metal tracks, said metal tracks extending parallel to the bit lines in said columns to form read data channels; and
wherein each read data channel is connected to all of the read amplifiers of the respective bit line.

12. The integrated circuit according to claim 11, further comprising a multiplexing element for each bit line that is configured to provide a data signal on an output bus of the non-volatile memory, based on the output signals delivered by the read amplifiers of the bit line.

13. The integrated circuit according to claim 12, wherein the multiplexing elements are located in a region extending in the direction of the rows and situated in the middle of the columns of the memory plane.

14. The integrated circuit according to claim 12, wherein the multiplexing elements are further configured to receive at least one decoding parameter signal transmitted respectively via at least one decoding parameter channel common to the multiplexing elements.

15. The integrated circuit according to claim 12, further comprising at least one redundant bit line, wherein the multiplexing element of the redundant bit line is configured to provide a redundancy data signal on a redundancy data channel, based on the output signals delivered by the read amplifiers of the redundant bit line, the redundancy data channel being connected to redundancy data inputs of the multiplexing elements of the other bit lines.

16. The integrated circuit according to claim 15, wherein said multiplexing elements of the other bit lines are configured to receive a redundancy data selection command on a redundancy data selection bus and, on the basis of the redundancy data selection command, provide said data signal based on the output signals delivered by the corresponding read amplifiers, or based on the redundancy data signal delivered on the redundancy data inputs.

17. The integrated circuit according to claim 15, wherein the redundancy data channel comprises two differential lines, the multiplexing element of the redundant bit line being configured to provide the redundancy data signal comprising two inverse digital signals.

18. The integrated circuit according to claim 11, wherein the read data channels each comprise two differential lines, each read amplifier being configured to provide the output signal comprising two inverse digital signals.

19. The integrated circuit according to claim 11, where each metal track has a minimum width greater than 0.5 µm.

20. The integrated circuit according to claim 19, wherein said at least one metal level further includes additional metal tracks for at least one electromagnetic shielding channel and one direct-access programming bus channel.

21. The integrated circuit according to claim 11, wherein the memory plane is segmented into memory plane segments, each bit line of each memory plane segment containing the read amplifier.

* * * * *